United States Patent
Hsieh

(10) Patent No.: US 7,820,525 B2
(45) Date of Patent: Oct. 26, 2010

(54) METHOD FOR MANUFACTURING HYBRID IMAGE SENSORS

(75) Inventor: Tzu-Chiang Hsieh, Fremont, CA (US)

(73) Assignee: e-Phocus, San Jose, CA (US)

( * ) Notice: Subject to any disclaimer, the term of this patent is extended or adjusted under 35 U.S.C. 154(b) by 0 days.

(21) Appl. No.: 12/383,717

(22) Filed: Mar. 25, 2009

(65) Prior Publication Data

US 2010/0248399 A1   Sep. 30, 2010

(51) Int. Cl.
*H01L 21/30* (2006.01)
*H01L 21/46* (2006.01)

(52) U.S. Cl. .................. 438/455; 438/608; 438/106; 438/199; 257/E21.17; 257/E21.006; 257/E21.053; 257/E21.085; 257/E21.126; 257/E21.304; 257/E21.352; 257/E21.499; 257/E21.632

(58) Field of Classification Search ............... 438/455, 438/608, 199, 60, 70, 75, 241, 311, 106, 438/116, 141, 197, 603, 604, 680, 692, 752, 438/753, 781, 782; 257/E21.17, E21.006, 257/E21.053, E21.085, E21.126, E21.304, 257/E21.352, E21.499, E21.632
See application file for complete search history.

(56) References Cited

U.S. PATENT DOCUMENTS

| | | | |
|---|---|---|---|
| 2003/0034501 A1* | 2/2003 | Higgins, Jr. | 257/140 |
| 2006/0274171 A1* | 12/2006 | Wang | 348/294 |
| 2009/0256156 A1* | 10/2009 | Hsieh | 257/72 |

\* cited by examiner

*Primary Examiner*—David Nhu
(74) *Attorney, Agent, or Firm*—John R. Ross

(57) ABSTRACT

A method for wafer-to-wafer bonding of a sensor readout circuitry separately fabricated with a silicon substrate to a photodiode device made of non-silicon materials grown from a separate substrate. In preferred embodiments the non-silicon materials are epitaxially grown on a silicon wafer. The bonding technique of preferred embodiments of the present invention utilizes lithographically pre-fabricated metallic interconnects to connect each of a number of pixel circuits on a readout circuit wafer to each of a corresponding number of pixel photodiodes on a photodiode wafer. The metallic interconnects are extremely small (with widths of about 2 to 4 microns) compared to prior art bump bonds with the solder balls of diameter typically larger than 20 microns. The present invention also provides alignment techniques to assure proper alignment of the interconnects during the bonding step.

25 Claims, 15 Drawing Sheets

METHOD FOR MANUFACTURING HYBRID IMAGE SENSORS

FIELD OF THE INVENTION

The present invention relates to hybrid image sensors and methods for manufacturing the sensors and more specifically to hybrid sensors manufactured using a wafer-to-wafer bonding process.

BACKGROUND OF THE INVENTION

CMOS Sensors

Active pixel CMOS sensors are well known. CMOS is an abbreviation for complementary metal oxide semiconductor. An active-pixel sensor (APS) is an image sensor consisting of an integrated circuit containing an array of pixel sensors (each pixel containing a photodiode and pixel circuitry containing an active amplifier) and reset and readout circuitry. CMOS sensors are produced by a CMOS process and have emerged as an inexpensive alternative to charge-coupled device (CCD) imagers. CMOS APS's consume far less power than CCD's, have less image lag, and can be fabricated on much cheaper and more available manufacturing lines. Unlike CCD's, CMOS APS's can combine both the image sensor function and image processing functions within the same integrated circuit. The silicon wafer is the substrate typically used in CMOS process. The spectral response of both CCD and APS sensors made of silicon is limited to the range approximately from 400 nm to 850 nm.

Non-Silicon Photodiodes

Most CMOS and CCD photodiodes are comprised of silicon doped with impurities to produce n and p regions, and sometimes there might be an un-doped intrinsic region separating the n and p regions. It is known that photodiodes can be produced with materials other than silicon. These materials include germanium, indium gallium arsenide, indium antimonide and indium arsenide. The photodiodes made of germanium, indium gallium arsenide, indium antimonide or indium arsenide can be made to detect photons in the spectral range from near infrared, short wave infrared, mid-wave infrared and long-wave infrared. However, almost all these photodiodes are made of materials incompatible with today's silicon-based CMOS process since these materials would become active once they go into CMOS circuitry and alter the electronic performance of the circuitry. As a result, these materials can not be incorporated into the CMOS processes or even be brought in close proximity to the fabrication lines.

Bump Bonding

Bump bonding (also called flip chip mating) is a sensor technology relying on a hybrid approach; it integrates a photodiode device made of non-silicon semiconductor materials to an electronic readout circuit fabricated on silicon substrate. Solder balls are formed on the readout circuits wafer to subsequently form interconnect joints to the photo-sensing devices. With this approach, the readout circuit and the photodiode portions are developed separately, and the sensor is constructed by bump bonding of the two. This method offers maximum flexibility in the development process, choice of fabrication technologies and the choice of sensor materials. Two of the major weaknesses of this technique are (1) the solder ball is large, typically larger than 20 micron in diameter using today's state of the art technique and (2) the difference in the thermal expansion characteristics between silicon and non-silicon materials, such as the semiconductors referred to above, is usually quite large so the difference in thermal expansion places limits on bump bonding. These two weaknesses make this bump bonding technique very difficult to scale up to multi-million pixel image sensors.

The Need

What is needed is a manufacturing technique producing hybrid image sensors with much better capability to scale up to multi-million pixel image sensors.

SUMMARY OF THE INVENTION

The present invention provides a method for wafer-to-wafer bonding of a sensor readout circuitry separately fabricated with a silicon substrate to a photodiode device made of non-silicon materials grown from a separate substrate. In preferred embodiments the non-silicon materials are epitaxially grown on a silicon wafer. The bonding technique of preferred embodiments of the present invention utilizes lithographically pre-fabricated metallic interconnects to connect each of a number of pixel circuits on a readout circuit wafer to each of a corresponding number of pixel photodiodes on a photodiode wafer. The metallic interconnects are extremely small (with widths of about 2 to 4 microns) compared to prior art bump bonds with the solder balls of diameter typically larger than 20 microns. The present invention also provides alignment techniques to assure proper alignment of the interconnects during the bonding step.

DESCRIPTION OF THE PREFERRED EMBODIMENTS

Photodiode Wafer

Figure 1:
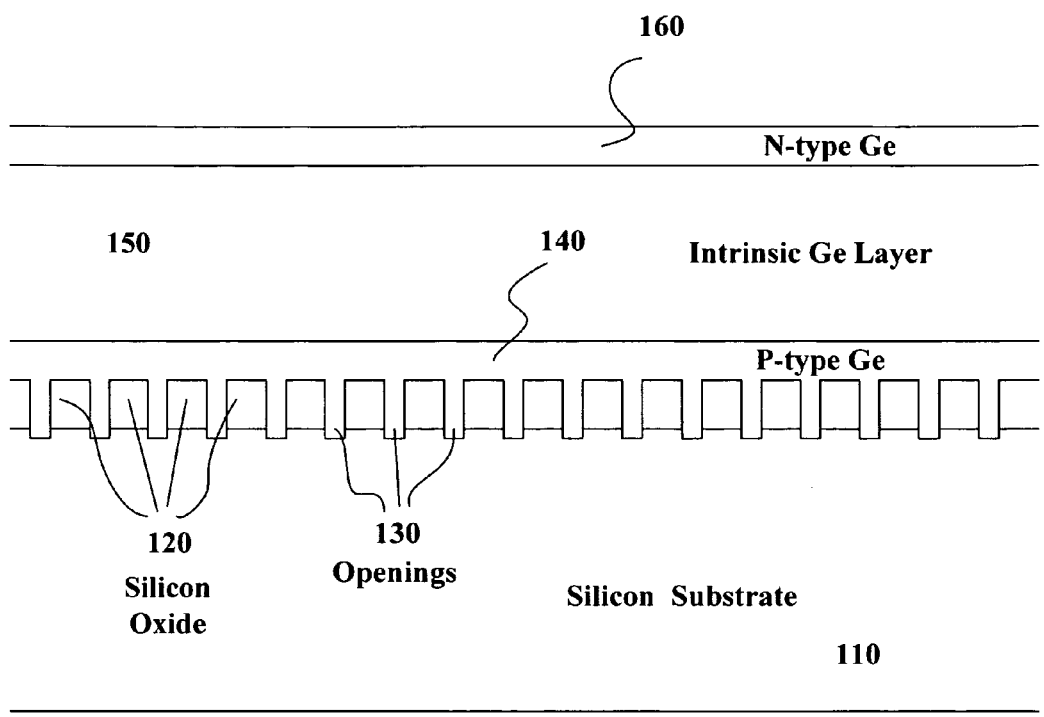
FIG. 1 is a schematic cross-sectional view of the photodiode layers fabricated on a silicon substrate.

FIG. 1 provides a schematic cross-sectional view of the photodiode layers epitaxially grown on a conductive P-type silicon substrate 110, preferably in wafer form. This wafer is referred as "photodiode wafer". One of the techniques used to grow epitaxial layers on silicon has been described in U.S. patent application Ser. No. 12/283,821 filed by Applicant on Sep. 15, 2009, where a photodiode island is formed within each pixel. In this embodiment the photodiode layers are made of epitaxially grown coalesced crystalline germanium with a P-I-N photodiode structure. As shown in FIG. 1, small openings 130 of about a few tenths of a micron in width are etched through the oxide layer 120 and over-etched slightly into the substrate 110. This over-etch is to ensure that no residual oxide at the bottom of the openings. Areas outside the openings are covered with an oxide layer 120 such as silicon oxide. The aspect ratio of the depth to width of the openings should be greater than 1, typically greater than 1.5. The pitches between two openings in both X and Y dimensions are preferably comparable to the width of the openings. However, it is not a critical dimension. These openings 130 are provided over the entire wafer. Using the chemical vapor deposition techniques, epitaxially grown crystalline P-type (P) germanium layer 140 is first formed inside the openings 130 and coalesced horizontally on the surface after the opening cavities are filled as shown in FIG. 1. Then an intrinsic (I) germanium layer 150 and an N-type (N) germanium layer 160 are subsequently grown on top of the P-type layer 140. Our preferred embodiment is to use these openings with a depth-to-width aspect ratio greater than 1.5 during the epitaxial growth of Germanium films. It allows an epitaxial growth of crystalline germanium films at a temperature typically lower than 700 C. In an alternative embodiment, we would not use these openings and have Germanium films directly deposited onto the silicon wafer. But, we need to either grow the epitaxial germanium film at a much elevated temperature, typically greater than 900 C, or anneal the wafer after deposition at greater than 900 C to crystallize the germanium films to be suitable for sensor applications. After the P-I-N photodiode layers are grown on the substrate, the entire wafer is covered with a conductive layer of a few hundreds to a few thousands of angstroms thick. In the preferred embodiment of the present invention, this conductive layer is made of Titanium Nitride. Other conductive materials can be used as well, for example gold, platinum, cobalt, chromium, titanium, tungsten, titanium tungsten alloy and highly doped poly-silicon.

Figure 2:
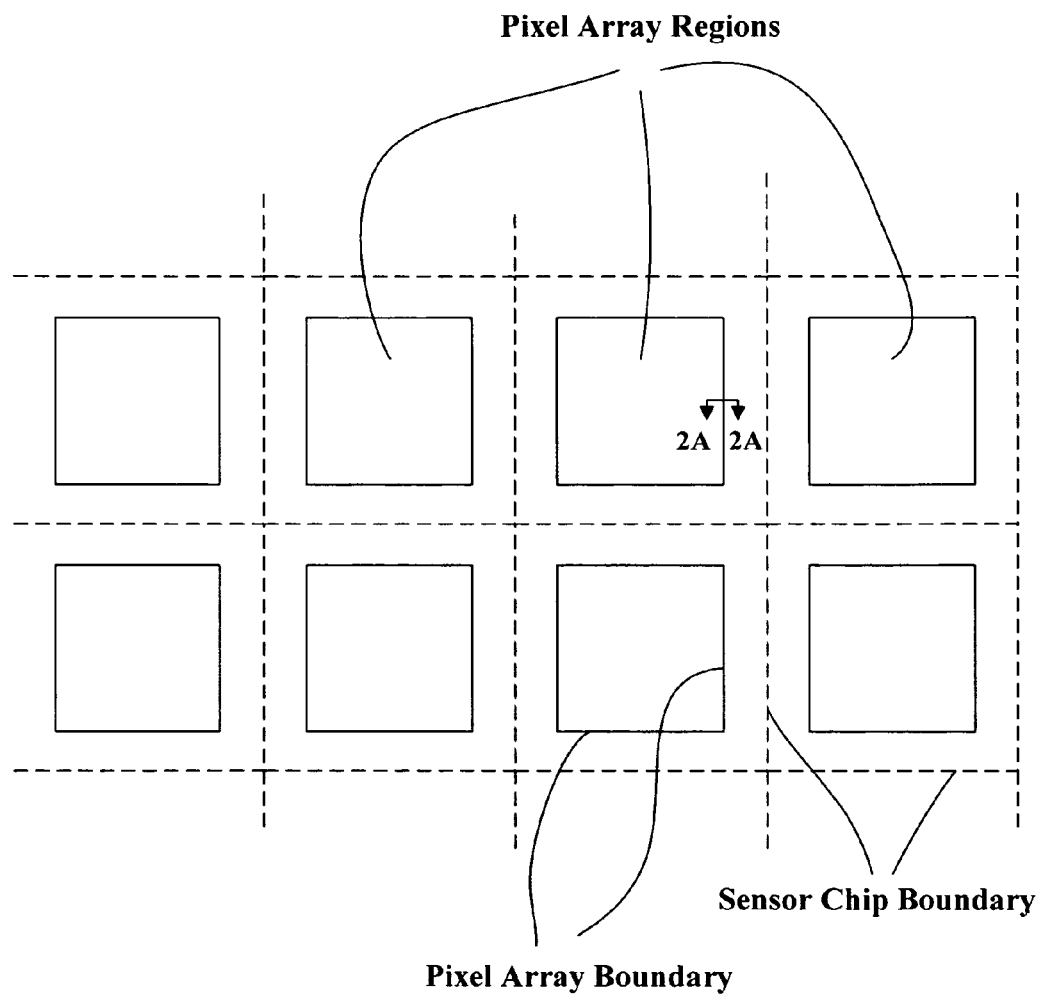
FIG. 2 is the top view of the photodiode wafer showing the photodiode pixel array regions and non-pixel region.
Figure 2A:
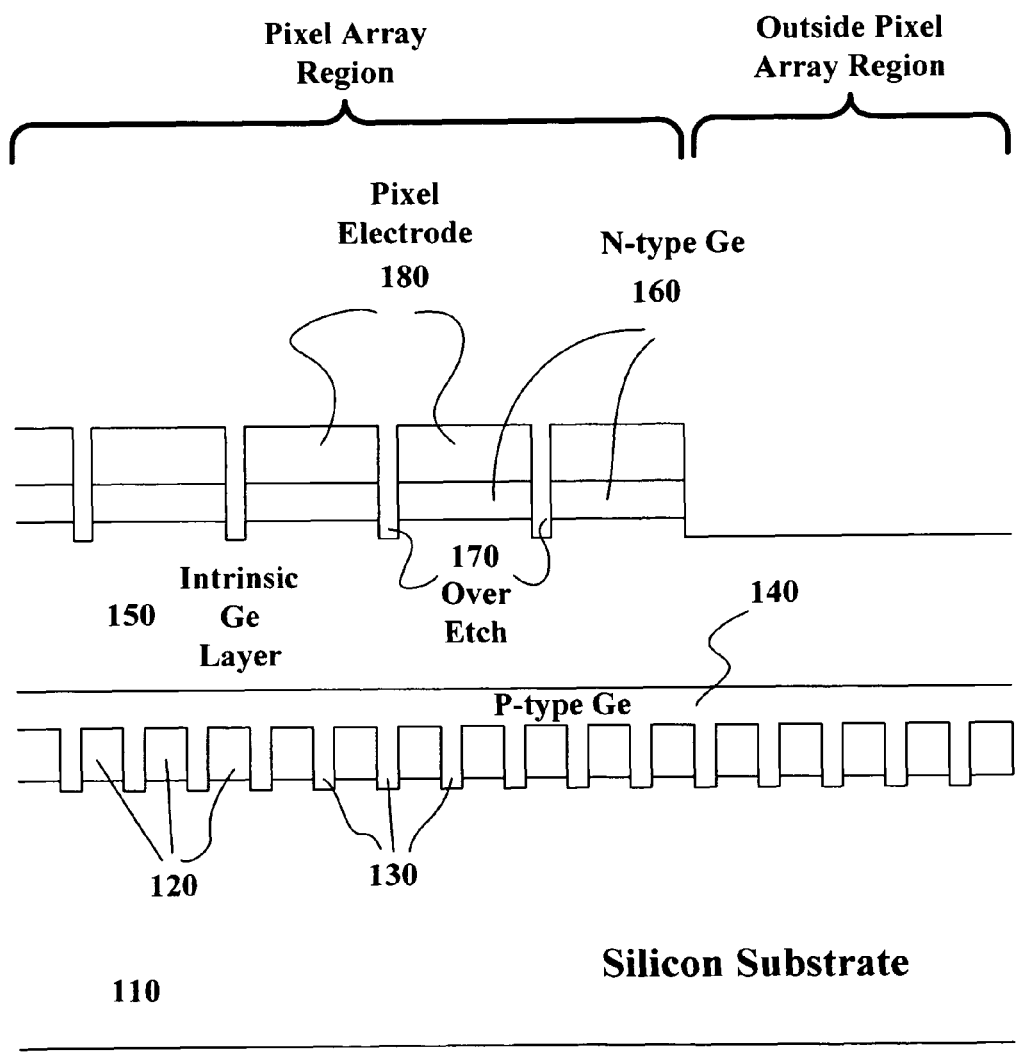
FIG. 2A is a schematic cross-sectional view of the photodiode layers covered with conductive pixel pads in the pixel array areas.
Figure 3:
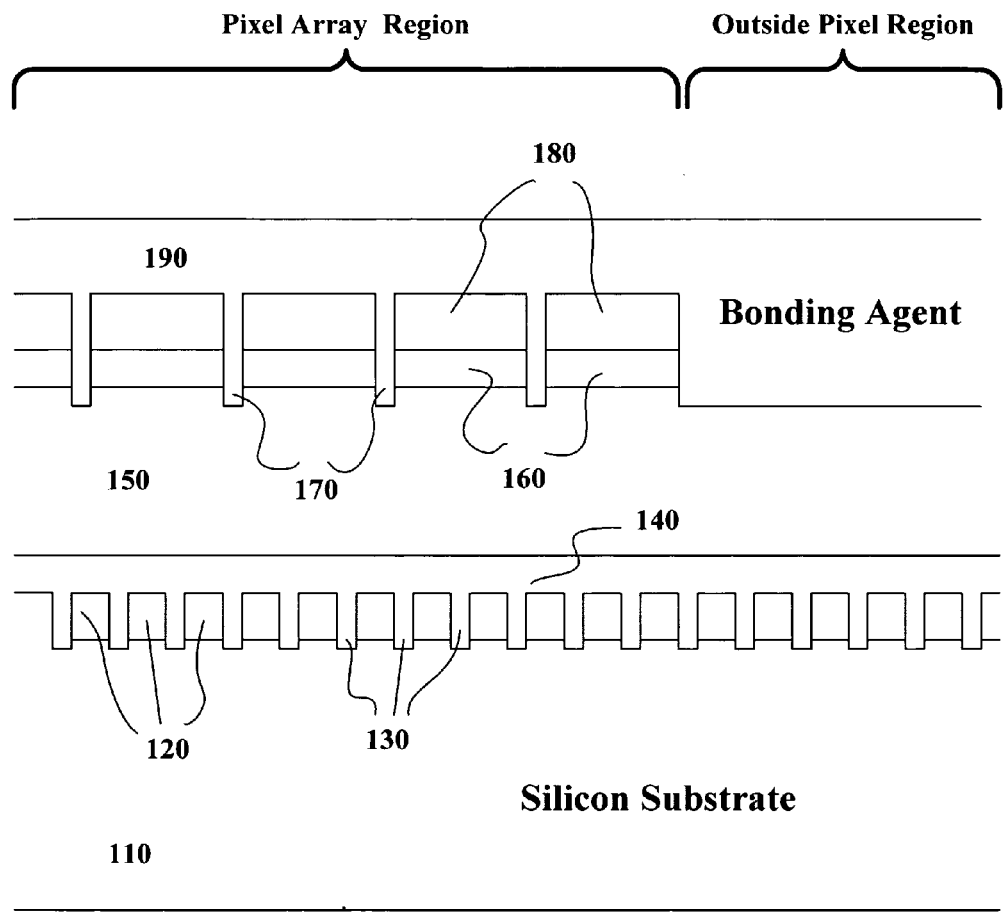
FIG. 3 shows the bonding agent covering the surface of the photodiode wafer.
Figure 4:
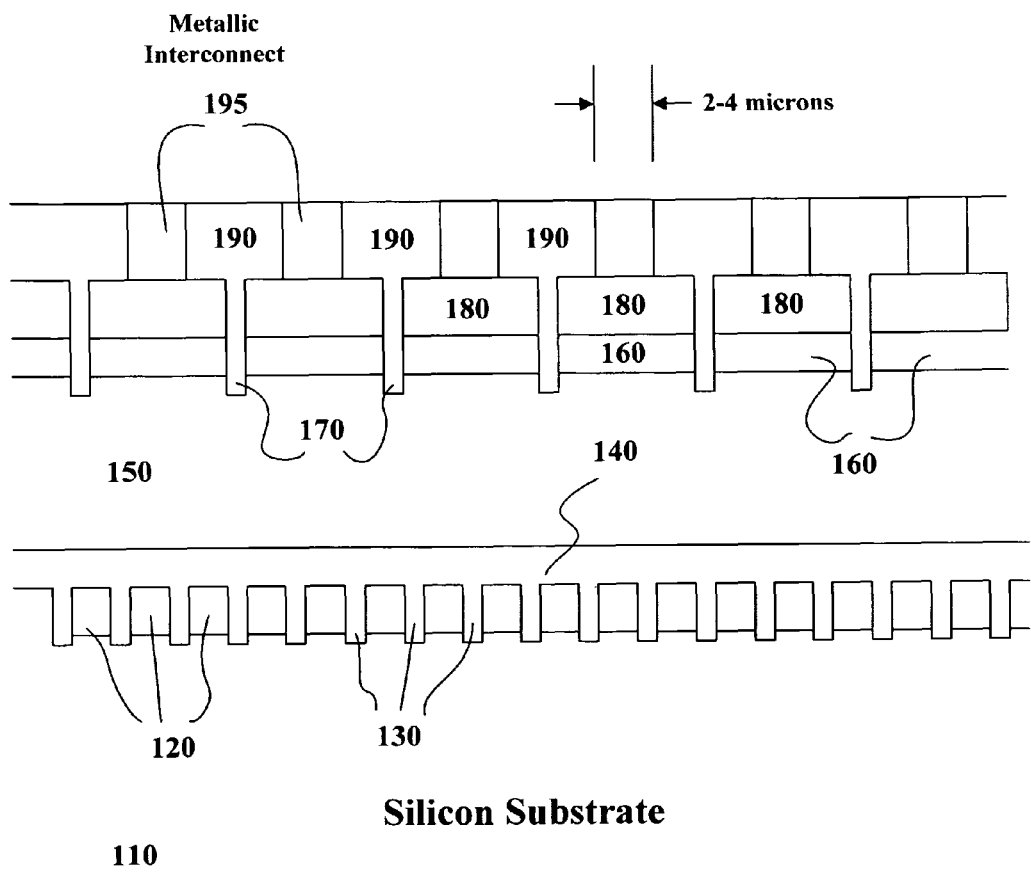
FIG. 4 shows the metallic contacts are formed inside the bonding agent.

The photodiode wafer will be used to make one or multiple sensors. The photodiode wafer is partitioned into one or more sensor regions, and each sensor region is partitioned into a pixel array region and non-pixel region as shown in FIG. 2. Each pixel array includes multiple pixels. In the pixel array regions, the conductive layer is patterned preferably into pads of square or rectangular shape, indicated at 180 in FIG. 2A. These pads 180 in the pixel array are referred to as "pixel pads' in this specification. During an etch process to form pixel pads 180, the etch region 170 continues through the underlying N-type layer 160 and slightly into the I-type 150 layer as shown in FIG. 2A. This results in a patterned N-type layer 160 in the pixel array region. This prevents current flow between the N-layer portions of two adjacent pixels. Each pixel photodiode in each pixel array is thus defined by a patterned metal pad 180 and a corresponding N-type layer 160. In the preferred embodiment of the present invention, the pixel pitches in both X and Y directions are approximately 5-7 microns. Since each pixel is defined by the patterned pixel pad 180 and N-type layer 160 on top of the photodiode portion of the sensor, each pixel can have one or multiple openings 130 at the bottom of the photodiode portion. The width of etch region 170 is approximately a few tenths to one micron. After the conductive and N-type layers are patterned in the pixel array area, the wafer surface is coated with the bonding agent 190, as shown in FIG. 3. The bonding agents can be silicon oxide such as spin-on glass (SOG) or polymers such as benzocyclobutene (BCB), parylene, polyimides, photo-resists and polymethylsiloxane. These materials have very good planarization characteristics which can accommodate feature scale non-planarity of 1-2 microns. The preferred embodiment of the present invention uses one of the above polymers in liquid form, which can be spin coated on the surface. After the spin coating, the wafer is heated to remove solvent and partially cross-linked portions of the polymer coating. After this partial cross-link step, the wafer is then patterned to create regions 195, where the polymer is removed and metallic materials are filled in regions 195 as shown in FIG. 4. The metallic materials used to fill in regions 195 are preferably copper, tantalum or a combination of both in the preferred embodiment of the present invention. Other metallic materials, such as but not limited to tin, gold, tungsten, titanium, tungsten, titanium nitride, titanium tungsten, cobalt, chromium, silver and aluminum can be used as well. The width of region 195 is approximately 2-4 microns. This can be accomplished by a combination of photolithography, metal deposition, etch, chemical mechanical polish (CMP) as well as other arts typically used in today's semiconductor production process. The end result of this process is a wafer with a planar surface regions consisting of metallic interconnects 195 through the bonding agent 190. The reason we make the width of 195 less than 4 microns is because the pixel pitch in our preferred embodiment is less than 7 microns. In other preferred embodiments where the pixel pitch is greater than 7 microns, the width of 195 can be made larger accordingly. The larger the width of 195, the easier it would be to do the alignment during the wafer to wafer bonding.

Readout Circuit Wafer

Figure 5:
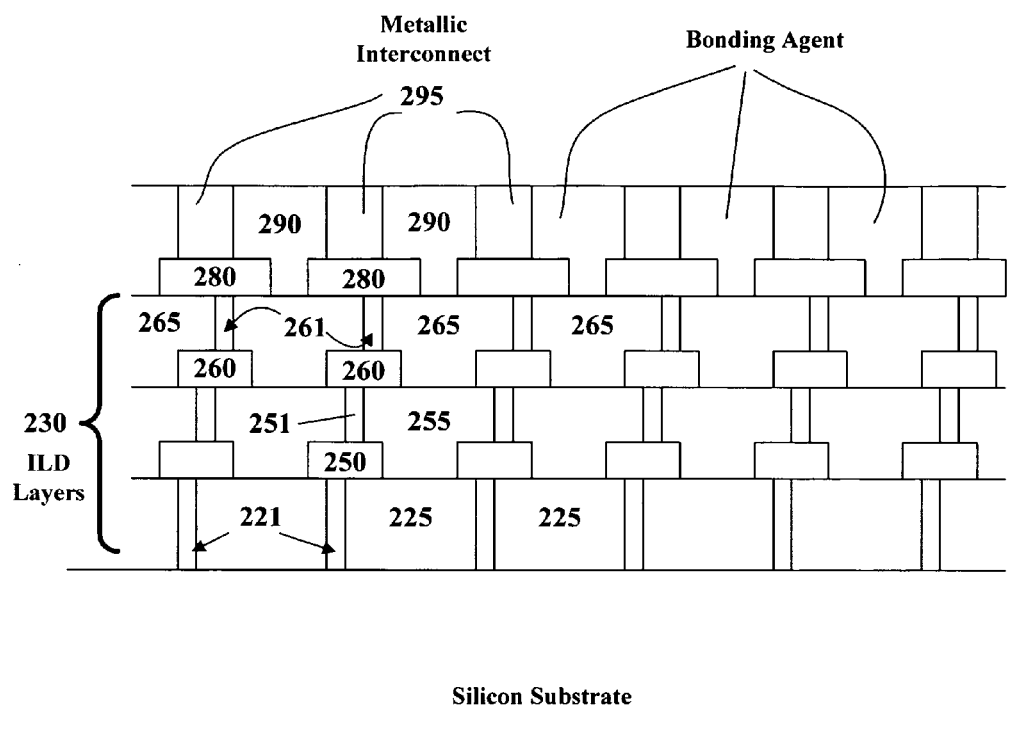
FIG. 5 is a schematic cross-sectional view of the pixel array areas of the CMOS readout circuit wafer covered with bonding agent and metallic contacts.

FIG. 5 a schematic cross-sectional view of a portion of a readout circuit showing an inter-dielectric layer region 230 formed on top of the substrate 210. This wafer is referred as "readout circuit wafer". In the preferred embodiment, the wafer substrate is made of silicon. The individual inter-dielectric layers, 225, 255 and 265 are made of silicon oxide. Metal lines and joints, such as 250 and 260 are formed in the inter-dielectric layers. Also included are vias, 221, 251 and 261 formed to inter-connect the metal lines or joints through the dielectric layer. In FIG. 5, top metal lines are illustrated as 280. A bonding agent layer 290 covers top metal lines 280. Just as in the steps described in FIG. 4, metallic interconnects, 295, are formed through the bonding agent 290 on top of the readout circuit wafer after 280 are patterned in the pixel array. The readout circuit wafer may have one or more readout circuits. Preferably, a single readout circuit is provided for each sensor expected to be fabricated by the combination of the photodiode wafer and the readout circuit wafer. In this embodiment the readout circuit to be used in each sensor is comprised of an array of pixel circuits and other sensor supporting circuitry. The readout circuit wafer provides the same number of readout circuits as the number of the pixel arrays on the photodiode wafer. Each readout circuit on the readout circuit wafer has a one-to-one correspondence to a pixel array on the photodiode wafer. Each readout circuit on the readout circuit will include individual pixel circuits corresponding to individual pixel photodiodes within pixel arrays on the photodiode wafer.

Bonding the Wafers

Figure 6:
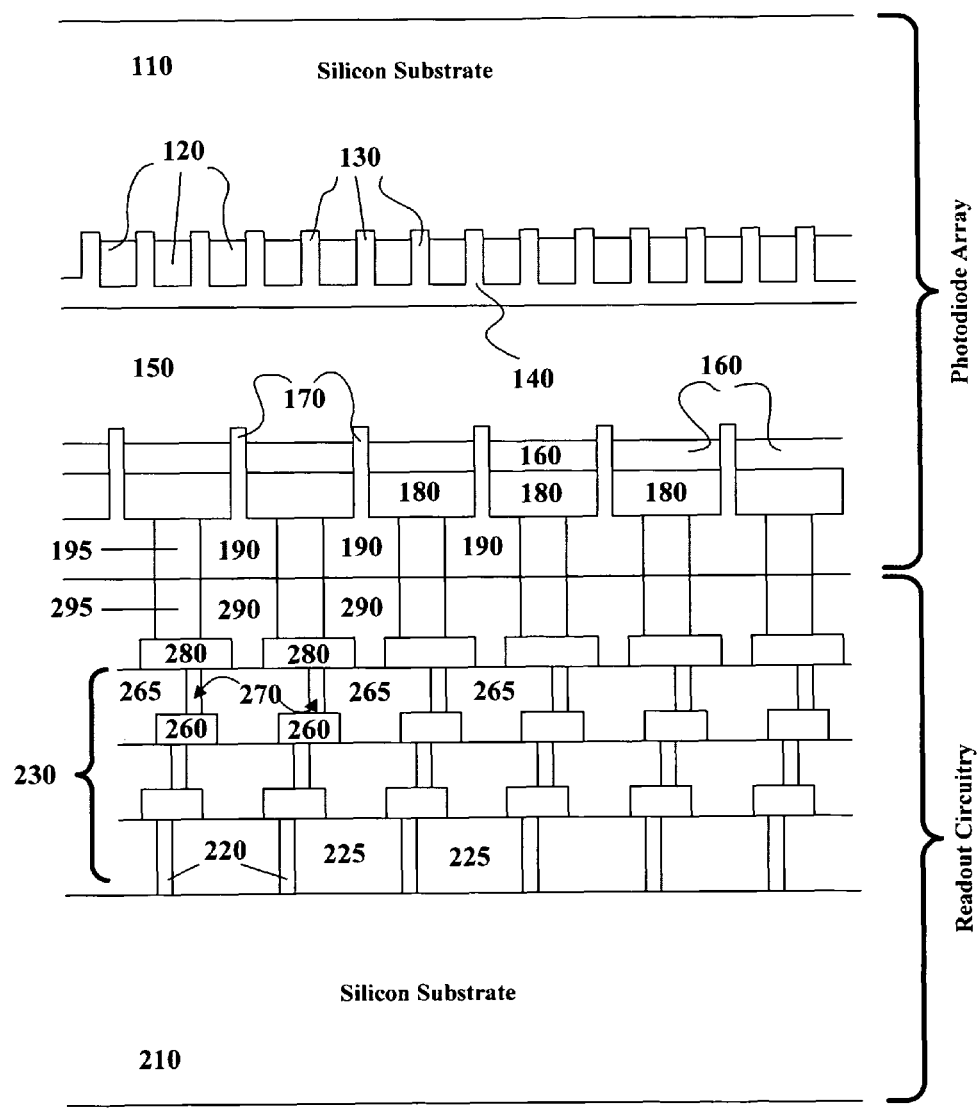
FIG. 6 shows a schematic cross-sectional view of the pixel array area when the photodiode wafer and CMOS readout circuit wafer are brought in face-to-face contact.

The photodiode wafer and readout circuit wafer are brought together face-to-face and aligned as shown in FIG. 6. In the preferred embodiment the hybrid sensor will have a pixel pitch of approximately 7 microns which is the distance between the centers of two pixel pads 180. The width of the metallic interconnects 195 and 295 is about 2-4 microns. The gap between the patterned pixel pad 180 and N-type regions 160 of two adjacent pixels is about a few tenths of a micron to one micron. For good connections between the interconnects of the photodiode wafer and those of the readout circuit wafer, the two wafers should be aligned to accuracies to less than 1 micron on the average. Some statistical variations will occur with respect to the individual interconnects but all interconnects should be aligned to within an accuracy of 2 microns. The alignment accuracy of today's state-of-the-art wafer-to-wafer bonding technique is about one micron. One technique in achieving an alignment of wafer-to-wafer bonding with one micron accuracy alignment is done by mechanically positioning one wafer with respect to another using optical registration technique. Alignment marks are made at the surface of both wafers. Two optical systems, one at the top and one at the bottom, are used to align the wafers. The top optical system focuses on the alignment mark on the surface of the top wafer, and the bottom optical system is to focuses on the alignment mark on the surface of the bottom wafer. Infrared light, which can penetrate through wafers, is used as the illumination source. Alignment is achieved when the top and bottom alignment marks are clearly imaged at the same location with an accuracy of less than 1.0 micron. One can coat the alignment marks with metal or other materials in order to increase the contrast ratio of the alignment marks relative to its surroundings. When the alignment is achieved, the two wafers will be brought to contact in a bonding fixture. Either a single two-dimensional alignment mark or two separate point alignment marks on each wafer may be used to achieve the alignment accuracy in both X and Y directions. In order to maintain the alignment accuracy when the two wafers are brought to contact, one can make concave alignment features on one wafer and convex alignment features on the other wafer or a combination of concave and convex marks on each wafer. When the two wafers are brought to contact, concave mark would naturally mate with a corresponding convex mark as to achieve alignment. A combination of the convex and concave features with the optical system can also be used with the optical system providing the final alignment. Commercial alignment equipment, EVG620, made by EV Group has been used in high volume production for wafer-to-wafer bonding with better than one micron accuracy based upon its proprietary alignment technique. These techniques could be applied to align the two wafers. Since each photodiode is defined by the patterned pads 160 and 180 not by the interconnect 195 or 295, the purpose of the alignment is to get the interconnect 195 and 295 connected electrically. The width of the interconnect 195 and 295 are 2-4 microns, a misalignment of less than one micron between 195 and 295 does not adversely affect the sensor. A misalignment in the range of between 1 micron and 2 microns can provide satisfactory results, but limiting the misalignment to 1 micron is definitely recommended. After aligning the two wafers together face-to-face in a bonding fixture, pressure can be applied to force the two wafer surfaces into intimate contact. Then the wafers stack is heated to an elevated temperature, but lower than 500 C, to achieve high quality of bonding. Because the temperature cycle is kept lower than 500 C, the readout circuitry will not be affected by the heat. The bonding strength is very high, which can withstand even mechanical grinding. A good review on the bonding agents and strengths can be found in the article "Aligned Wafer Bonding for 3-D Interconnect" in the Aug. 1, 2005, Semiconductor International Magazine by Lu et al, cited here as reference. For some bonding agents, either high electrical voltage or high contact pressure alone has been used to realize the wafer to wafer bonding.

Completing the Image Sensor

Figure 7A:
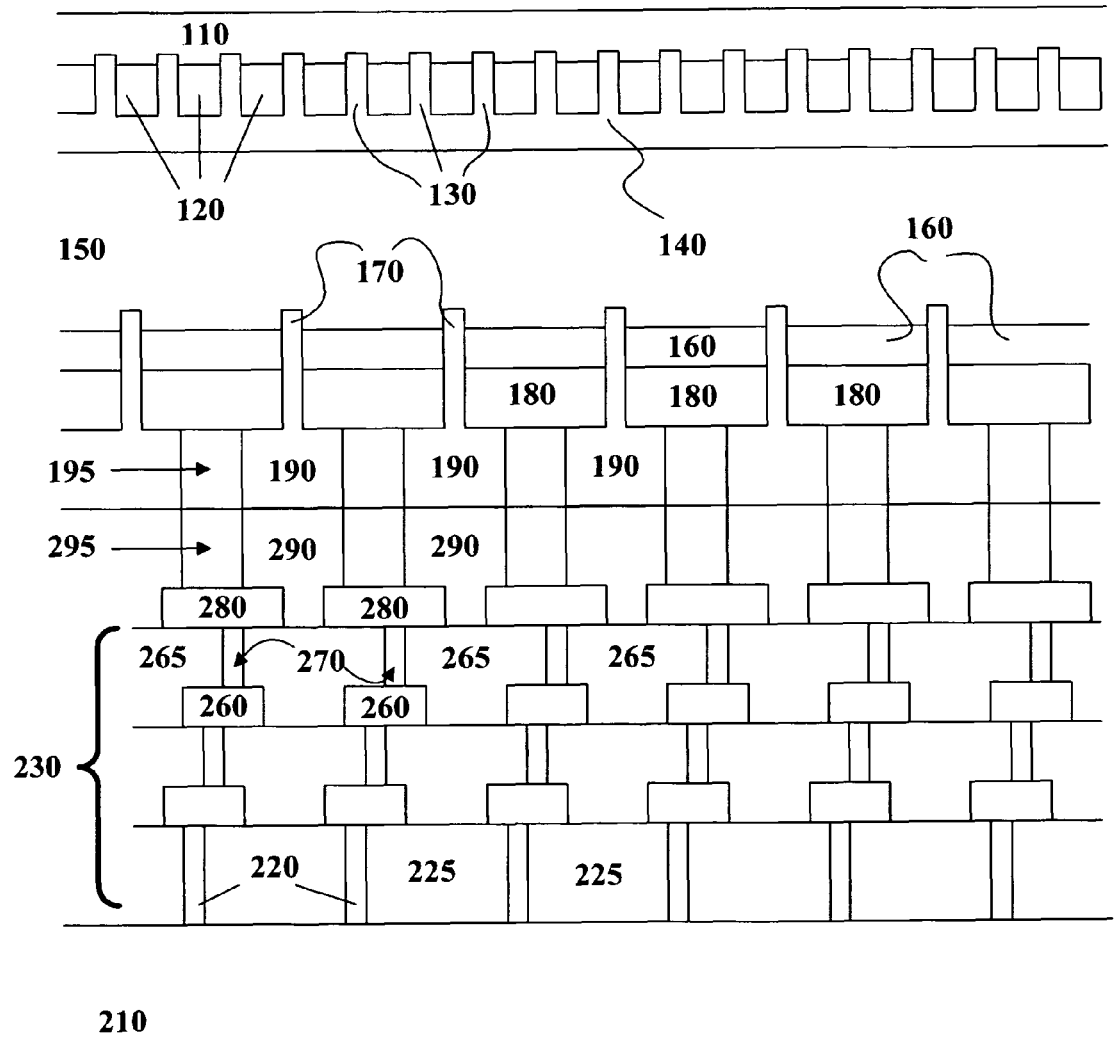
FIG. 7A shows the substrate of the photodiode wafer is thinned down.

After the bonding, the silicon substrate 110 shown in FIG. 7 is thinned down as shown in FIG. 7A with the use of a combination of mechanical grinding, polish and chemical polish. In an alternative embodiment, the entire silicon substrate can be chemically etched down to non-silicon materials 130 and oxide layer 120 as shown in FIG. 7A. In this alternative embodiment, a conductive electrode (such as Indium Tin Oxide) of a few hundreds of angstrom thick which is transparent in the spectral range of the target applications is preferably deposited to the surface to provide electrical contact to the top layer of the photodiode.

Figure 7B:
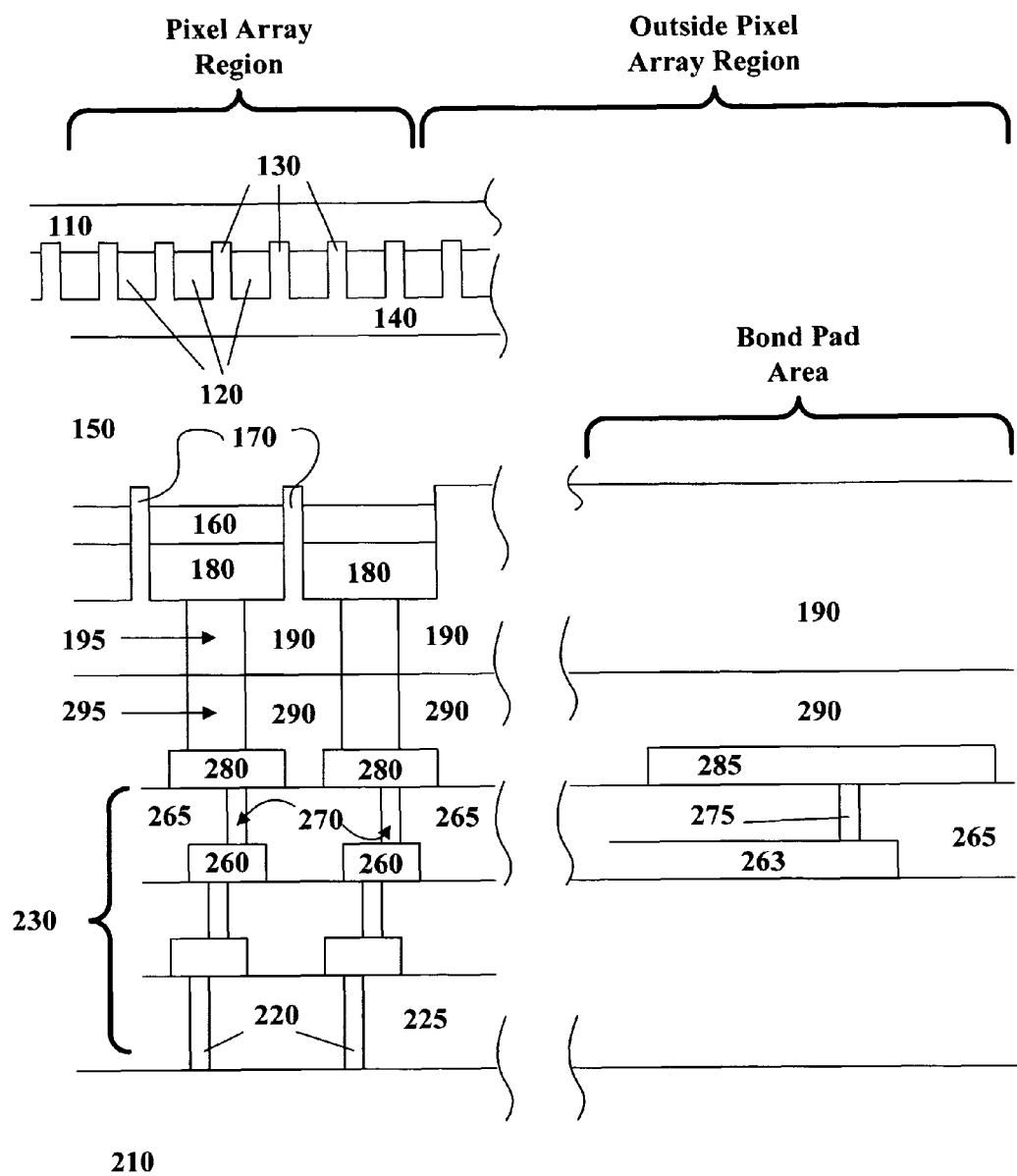
FIGS. 7B-7D shows the sequence of opening up the bond pads and formation of metallic contact to the top layer of the photodiode.
Figure 7C:
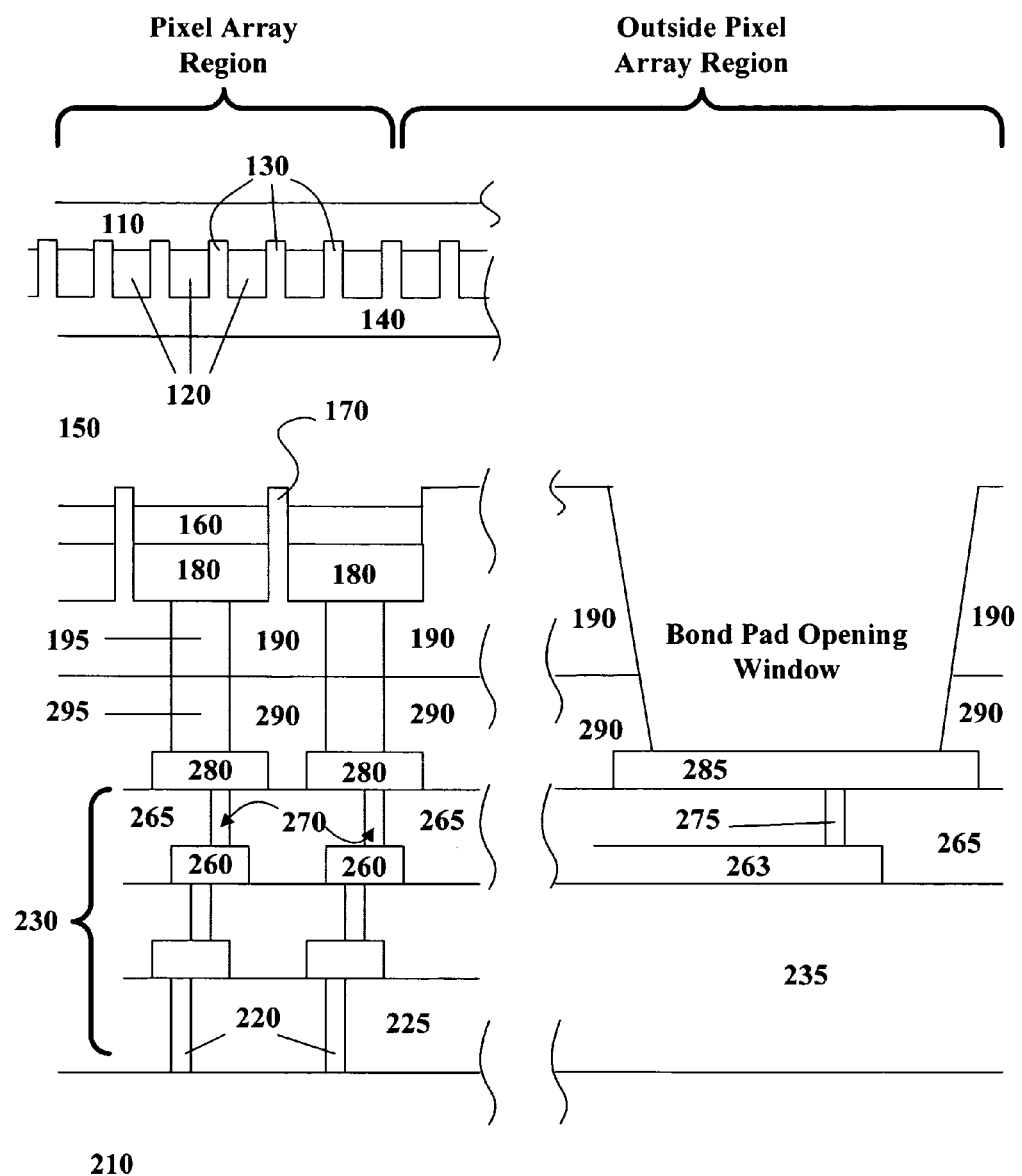
Figure 7D:
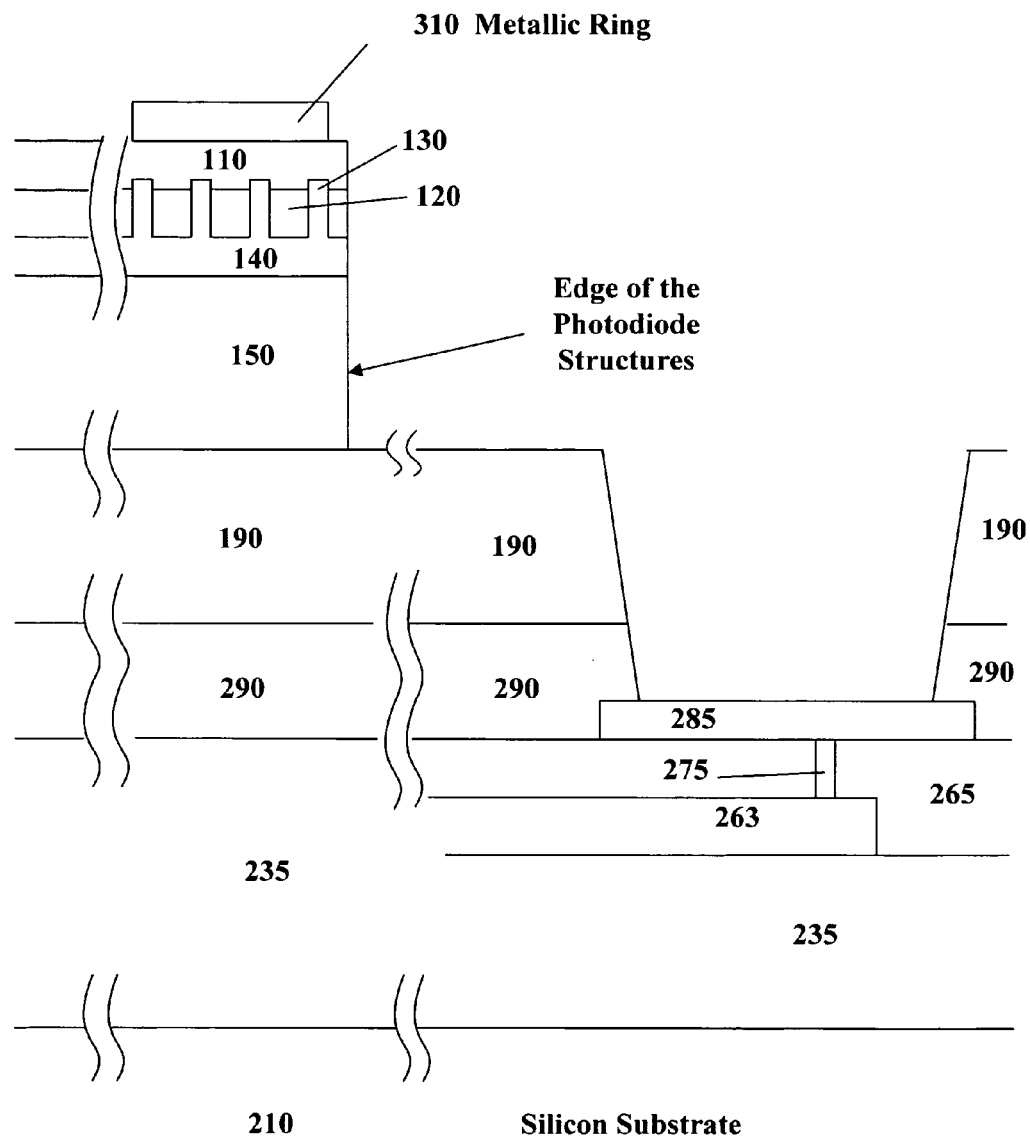
Figure 8A:
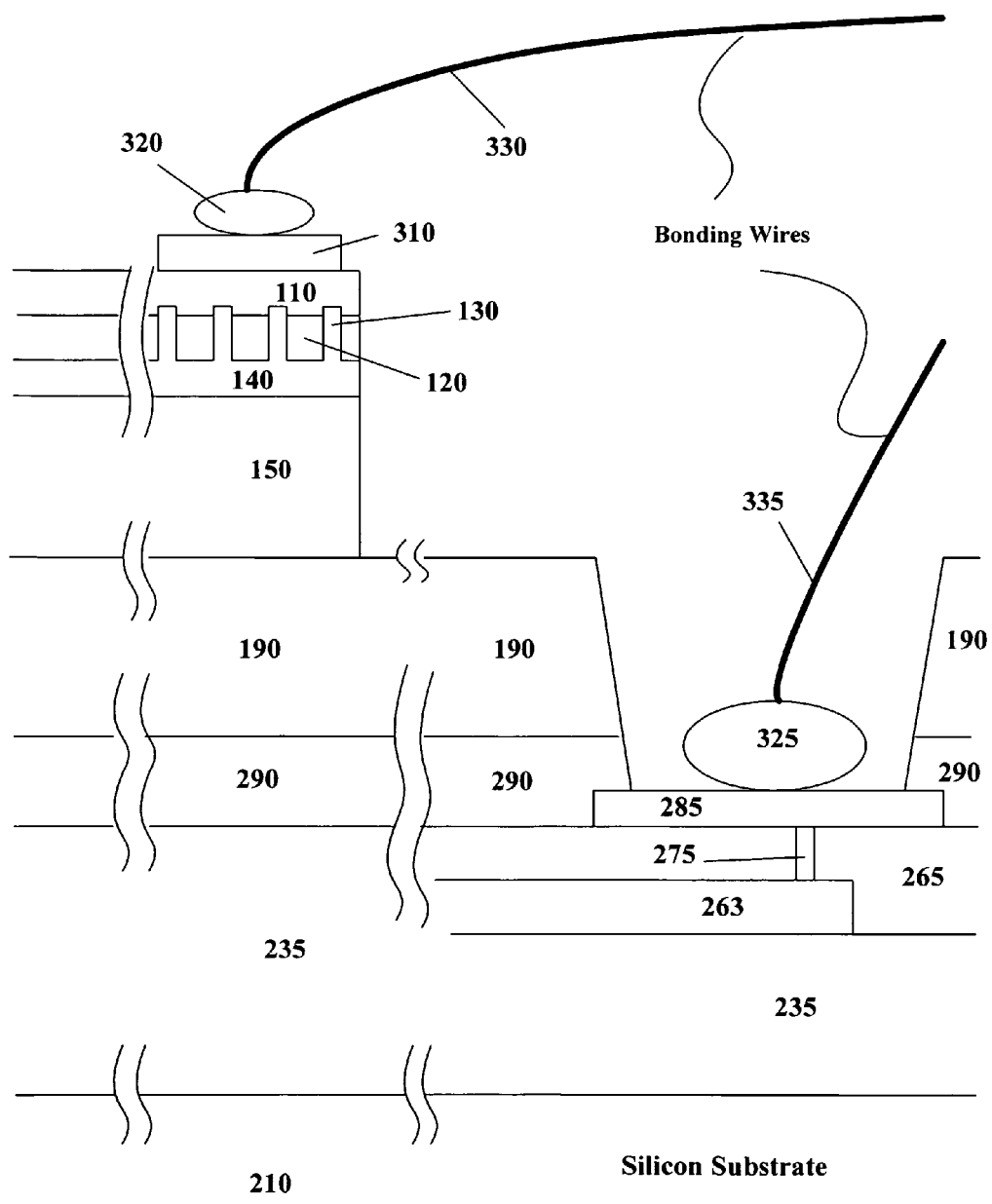
FIGS. 8A and 8B shows a first preferred embodiment of wire bonding of the metallic contact on the top layer of photodiode and a typical bond pad to the bond pads of a package carrier.
Figure 8B:
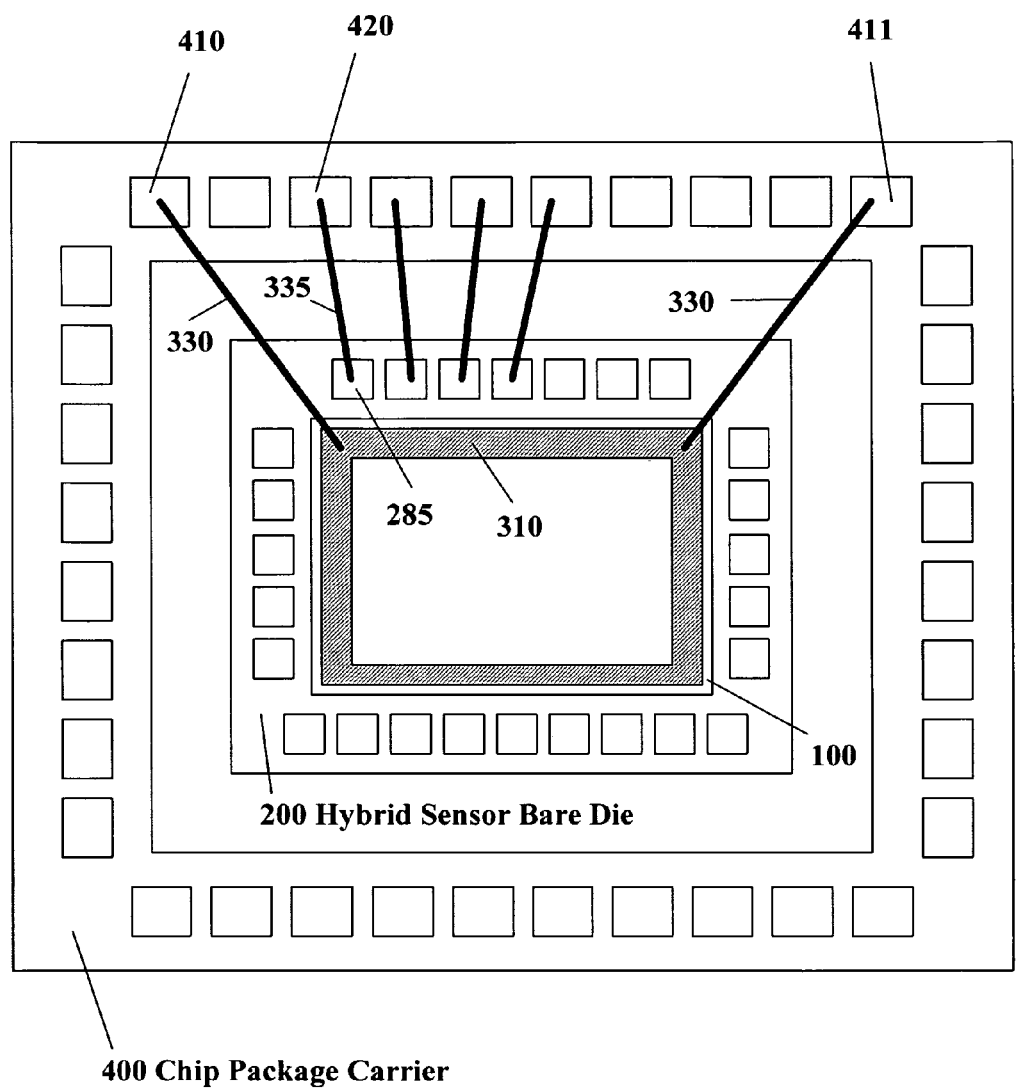

If the image sensor is only to be used for infrared imaging, the silicon substrate can be thinned down to just a couple of microns thick which could be used as a protection layer and/or an absorbing filter for visible light. In preferred embodiments of the present invention, substrate 110 is P-type silicon as explained above which is conductive enough to serve as interconnect to 140, the anode of the pixel photodiodes, as shown in FIG. 7A. However, in an alternative embodiment as indicated above, a conductive transparent layer such as Indium Tin Oxide (ITO) can be deposited on top of thinned P-type substrate to improve electrical conduction. FIG. 7A shows the pixel array area. FIG. 7B shows a cross-sectional view of a wire bond pad 285 formed on the "readout circuit wafer". This wire bond pad 285 is connected to another metal line 263 through vias 275 in the dielectric layer 265. The metal line 263 is connected electrically to other circuits not shown. In areas outside the pixel array, there are no metallic lines or joints like 180; the silicon substrate 110, the photodiode layers 140, 120 and 160, as well as the oxide layer 160 are removed by a combination of various chemical etch processes. FIG. 7B is a cross-sectional view of a wire bond pad area where the top surface will be flushed to the surface of the bonding agent 190. Photolithography and etch techniques typically used in semiconductor production processes are used to open up the bonding agents 190 and 290 to have the wire bond pad 285 exposed, as shown in FIG. 7C. As shown in FIG. 7D, a metal ring 310 is deposited at the perimeters of the photodiode covered region which extends outwards beyond the pixel array area. This extension is to provide a mechanical boundary of the pixel array and not intend to provide photo-sensing function; therefore, under the extended areas there is no metal interconnect to the cathode of the photodiode from the readout circuits. In FIG. 8A wires 330 and 335 are wire bonded to the metal ring 310 and wire bond pad 285 forming ball-shape formations 320 and 325. FIG. 8B shows the top view of the hybrid sensor 200 inside a chip carrier 400. The boundary of the photodiode layers is defined by covered area 100 and metal ring 310. Wire 330 is connected to a pad 410 on the chip carrier. Sometimes it is desirable to use multiple wires bonded to different pads geometrically distributed at multiple edges of the chip, like pad

411. This minimizes the distribution effect of voltage drop due to finite resistance of the metal ring as well as the substrate in order to maintain a somewhat constant bias voltage to the anode of the photodiode in all pixels of the sensor. This is helpful especially if the chip area is large. The bond pad 285 of the hybrid image sensor is wire-bonded by wire 335 to a carrier pad 420 on the chip carrier.

Figure 8C:
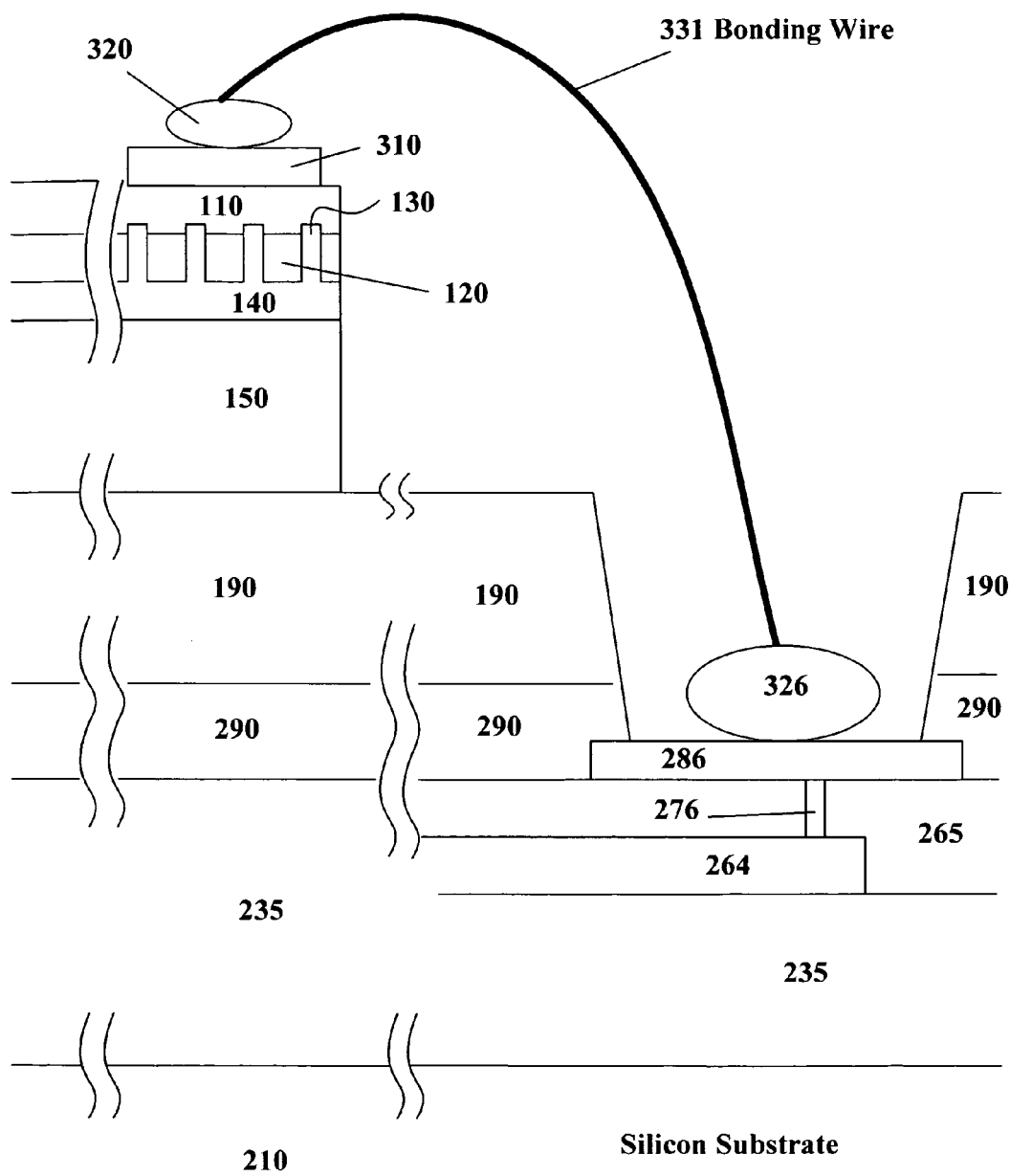
FIGS. 8C and 8D shows a second preferred embodiment of wire bonding of the metallic contact on the top layer of photodiode and a typical bond pad to the bond pads of a package carrier.
Figure 8D:
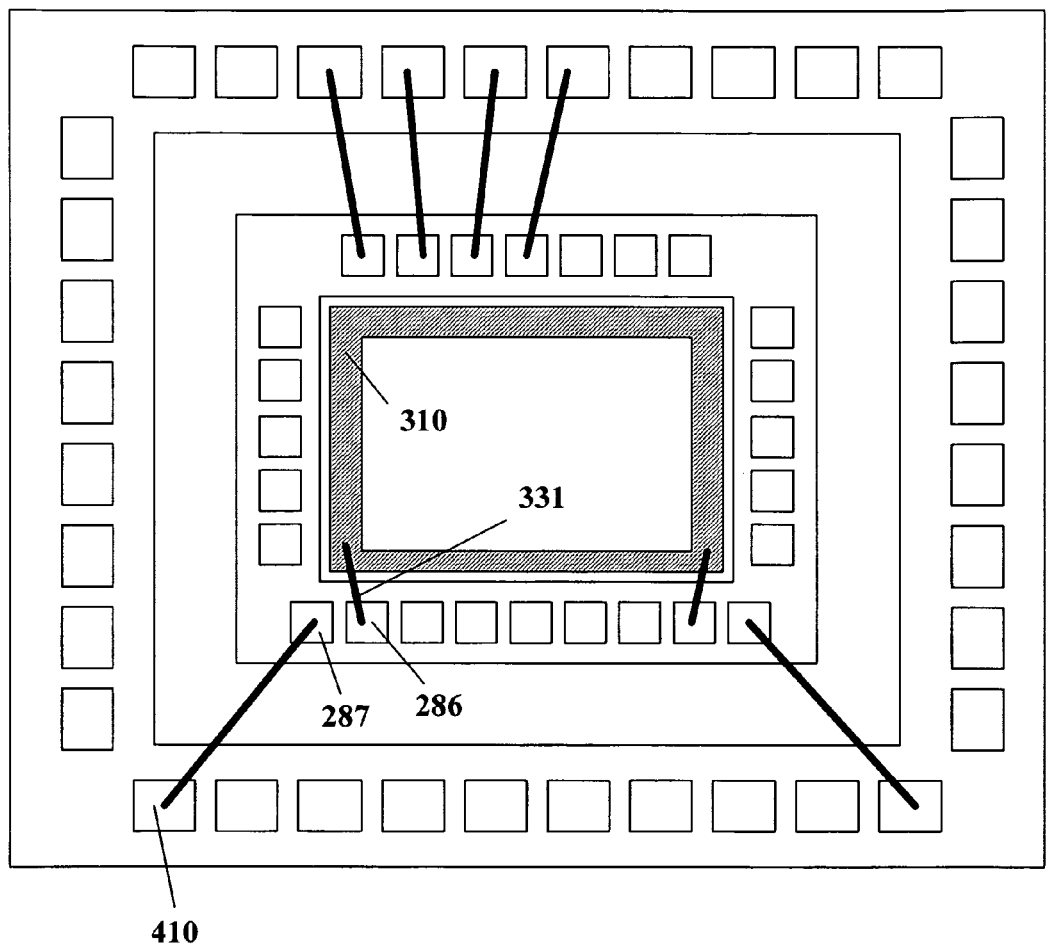

In FIG. 8C, a different embodiment is shown to provide the electrical bias voltage to the anode of the photodiode. A wire bond 331 is used to connect the metal ring 310 to a metal pad 286 via wire bond 326. In FIG. 8D bond pad 287 is connected to pad 410 on the chip carrier. Pad 286 is electrically connected to bond pad 287 by vias and metal lines through the inter-dielectric layers, not shown here.

Other Photodiode Materials

Several embodiments of the present invention are described in detail above proposing the use of crystalline germanium epitaxially formed via openings through oxide coated silicon substrate to produce photodiode arrays useful for providing image sensors sensitive in the low energy infrared spectral ranges. Persons skilled in the teaching of the present application will realize that the teachings of this application can be applied to other spectral ranges by use of different materials. For example semiconductor substrates other than silicon such as germanium and combinations of Group III and V could be used. Other photodiode materials could be deposited to create the photodiode layers. For example, silicon is preferred to the spectral range of 190-1100 nm; indium gallium arsenide is preferred for the spectral range of 700 to 2600 nm, indium antimonide is preferred for the range of 1000-5500 nm, indium arsenide for the range of 1000-3800 nm, and platinum silicide is preferred for the range 1000 to 5000 nm. Germanium is preferred for the spectral range of 400 to 1700 nm. In the openings, lattice matching buffer layer made of different materials may be used to reduce the lattice mismatch between the substrate and the photo-sensing layers. For example, one can use $Si_xGe_{1-x}$ as the buffer by gradually decreasing the Si concentration to grow all Ge epitaxial layer on silicon substrate. In other examples, germanium can be used as the lattice mismatch buffer to grow III-V materials on silicon substrate. Indium phosphide (InP) may be used in conjunction with germanium to grow indium gallium arsenide on silicon substrate. Other known methods for providing epitaxial crystalline growth of the photodiode material in the photodiode islands are possible variations. The polarity shown in the examples can be changed. For example the substrate can be N-type instead of P-type, as a result of it, in the layer examples the bottom layer would be doped P-type and the top layer doped N-type. The substrate described in the method also includes silicon-on-insulator (SOI) substrate where a layered silicon-insulator-silicon substrate is used in place of the conventional silicon substrates.

The width of the openings penetrating through the dielectric materials can vary from a size ⅕ of the thickness of the dielectric material to a size as large as the thickness of the dielectric material. The purpose of this opening as explained above is to enable the epitaxial growth of the electromagnetic radiation detection material relying on the crystalline structure of the substrate. In general the larger the width of the openings, the poorer the quality of the epitaxial films grown will be; however, good or excellent epitaxial growth may not be required. If it is, a post high temperature anneal may improve the quality to be useful. In the preferred embodiment, bonding agents are applied to the top of both the photodiode wafer and readout circuit wafer. However, in case the conductive pixel pad of the pixel photodiodes can be adhered to the bonding agent, one can simply apply the bonding agent to the top of the readout circuit wafer and have the conductive interconnects of the pixel readout circuit making electrical contact to the conductive pixel pad of the pixel photodiode directly. In the same token, in the case the pixel conductive element of the pixel readout circuit can be adhered to the bonding agent, one can simply apply the bonding agent to the top of the photodiode wafer and have the conductive interconnect of the pixel photodiode making electrical contact to the pixel conductive element of the pixel readout circuit directly.

While there have been shown what are presently considered to be preferred embodiments of the present invention, it will be apparent to those skilled in the art that various changes and modifications can be made herein without departing from the scope and spirit of the invention. In this application and in the claims the term photodiode is meant to include any photodetector adapted to detect photons using n and p type materials including photo-capacitors, N-P photodiodes, N-I-P photodiodes, three terminal N-P-N as well as P-N-P photodetectors, and hetero junction photodiode made of multiple layers of III-V materials such as the hetero junction photodiode made of a selective combination of indium phosphide (InP), gallium nitride (GaN), aluminum gallium nitride (AlGaN), gallium arsenide (GaAs), aluminum arsenide (AlAs), indium aluminum arsenide (InAlAs), indium gallium arsenide (InGaAs), indium gallium aluminum arsenide (InGaAlAs) and aluminum gallium arsenide (AlGaAs). The sensor could be adapted for imaging infrared, ultraviolet light or x-rays by use of appropriate infrared, ultraviolet or x-ray absorbing material in the photodiode layer. Also, the sensor could be adapted for imaging x-ray by applying a surface layer (such as cesium iodide) adapted to absorb x-rays and to produce lower energy radiation that in turn is converted into electrical charges in the photodiode layer. Many CMOS readout circuit designs could be adapted using the teachings of the present invention to produce hybrid image sensors of many million pixel arrays.

What is claimed is:

1. A method for making a hybrid image sensor utilizing a wafer-to-wafer bonding technique comprising:

A) utilizing a first lithographic process to fabricate on a first wafer at least one readout circuit, each of said at least one readout circuit comprising an array of pixel readout circuits and also comprising supporting circuits, each pixel readout circuit in said array of readout circuits comprising at least one pixel conductive element, B) including, during the first lithographic process the deposition of a first bonding agent layer covering the at least one readout circuit, C) including in each pixel of the array of pixel readout circuits at least one lithographically produced conductive interconnect passing through said first bonding agent layer to provide electrical communication to said at least one pixel conductive element, all of the conductive interconnects in the array of pixel readout circuits defining a set of pixel readout circuit interconnects, D) utilizing a second lithographic process to fabricate at least one array of pixel photodiodes of on a second substrate wafer to define a photodiode wafer and an array of pixel photodiodes, each pixel photodiode in the array of pixel photodiodes defining at least a photodetector structure and a conductive pixel pad, E) including, during the second lithographic process the deposition of a second bonding agent layer covering the array of pixel photodiodes, F) including, during the second lithographic process in each pixel photodiode in the array of pixel photodiodes at least one lithographically produced conductive interconnect passing through said second bonding agent layer to provide electrical communication to the conductive pixel pad of the pixel photodiode, all of the conductive interconnect in the array of pixel photodiodes defining a set of pixel photodiode interconnects, G) fabricating on each of the photodiode wafer and the readout circuit wafer at least one alignment feature adapted to permit alignment of the set of pixel photodiode interconnects on the photodiode wafer to the set of pixel readout circuit interconnects on the readout circuit wafer to an accuracy of less than 2 microns, and H) positioning one of the two wafers together face to face so as to align the set of photodiode interconnects to the set of pixel readout circuit interconnects to an accuracy of less than 2 microns so as to permit the bonding agent to bond the two wafers together providing electrical contact between the readout circuit interconnects and the photodiode interconnects so as to electrically connect each pixel readout circuit on the readout circuit wafer to a pixel photodiode on the photodiode wafer.

2. The method of making a hybrid image sensor according to claim 1 wherein said at least one readout circuit is a plurality of readout circuits and said at least one array of pixel photodiodes is a plurality of pixel photodiode arrays.

3. The method of making a hybrid image sensor according to claim 2 wherein the plurality of readout circuits and photodiode arrays is a number of circuits and arrays that can conveniently fit on the respective wafers.

4. The method of making a hybrid image sensor according to claim 1 wherein the readout circuit wafer and the photodiode wafer are both wafers comprised of a Group IV substrate.

5. The method of making a hybrid image sensor according to claim 1 wherein the readout circuit wafer and the photodiode wafer are both wafers comprised of a silicon substrate.

6. The method of making a hybrid image sensor according to claim 1 wherein the readout circuit wafer and the photodiode wafer are both wafers comprised of a combination Groups III and V material.

7. The method of making a hybrid image sensor according to claim 1 wherein the readout circuit wafer and the photodiode wafer are both wafers comprised of a silicon-on-insulator material.

8. The method of making a hybrid image sensor according to claim 1 wherein said photodiode comprises at least germanium.

9. The method of making a hybrid image sensor according to claim 8 wherein each photodiode also comprises at least one layer of N-type doped germanium and one layer of P-type doped germanium.

10. The method as in of making a hybrid image sensor according to claim 9 wherein each photodiode also comprises an intrinsic germanium layer.

11. The method of making a hybrid image sensor according to claim 1 wherein each of the photodiode wafer and the readout circuit wafer marked with alignment marks to permit alignment with an accuracy of less than two microns.

12. The method of making a hybrid image sensor according to claim 1 wherein each of the photodiode wafer and the readout circuit wafer marked with alignment marks to permit alignment with an accuracy of less than one micron.

13. The method of making a hybrid image sensor according to claim 10 wherein said method includes steps of creating an insulating layer over the wafer substrate material and creating tiny spaced apart openings through the insulating layer and slightly into the substrate material prior to producing a first germanium layer.

14. The method of making a hybrid image sensor according to claim 13 wherein the tiny spaced apart openings define a width of less than one micron.

15. The method of making a hybrid image sensor according to claim 14 wherein the germanium is grown in an epitaxial configuration.

16. The method of making a hybrid image sensor according to claim 15 wherein the first germanium layer grown on the insulator covered substrate is a P-type doped germanium epitaxial layer.

17. The method of making a hybrid image sensor according to claim 1 wherein bonding agent layer is spin coated onto said wafers.

18. The method of making a hybrid image sensor according to claim 1 wherein the bond agent layer comprises a material chosen from a group of materials consisting of spin-on-glass (SOG), benzocyclobutene (BCB), parylene, polyimides, photoresists, and polydimethylsiloxane.

19. The method of making a hybrid image sensor according to claim 1 wherein each photodiode array of the photodiode wafer has a one-to-one correspondence with a readout circuit on the readout circuit wafer.

20. The method of making a hybrid image sensor according to claim 1 wherein said conductive pixel pad comprises material chosen from a group of conducting materials consisting of titanium, titanium nitride, cobalt, chromium, gold, silver, platinum, tungsten, titanium tungsten and aluminum.

21. The method of making a hybrid image sensor according to claim 1 wherein said photodiode layers comprise of a single or a combination of materials chosen from a group of materials consisting of silicon, germanium, indium phosphide, indium gallium arsenide, indium gallium aluminum arsenide, gallium arsenide, aluminum arsenide, indium aluminum arsenide, indium antimonide, gallium nitride, aluminum gallium nitride, indium arsenide, platinum silicide, other III-V or II-VI or IV-VI compound semiconductors.

22. A method for making a hybrid image sensor utilizing a wafer-to-wafer bonding technique comprising:

A) utilizing a first lithographic process to fabricate on a first wafer at least one readout circuit, each of said at least one readout circuit comprising an array of pixel readout circuits and also comprising supporting circuits, each pixel readout circuit in said array of readout circuits comprising at least one pixel conductive element, B) utilizing a second lithographic process to fabricate at least one array of pixel photodiodes of on a second substrate wafer to define a photodiode wafer and an array of pixel photodiodes, each pixel photodiode in the array of pixel photodiodes defining at least a photodetector structure and a conductive pixel pad, C) including, during the second lithographic processes the deposition of a bonding agent layer covering at least a substantial portion of the photodiode wafer, D) including, during the second lithographic process in each pixel photodiode in the array of pixel photodiodes at least one lithographically produced conductive interconnect passing through said second bonding agent layer to provide electrical communication to the conductive pixel pad of the pixel photodiode, all of the conductive interconnect in the array of pixel photodiodes defining a set of pixel photodiode interconnects, E) fabricating on each of the photodiode wafer and the readout circuit wafer at least one alignment feature adapted to permit alignment of the set of pixel photodiode interconnects on the photodiode wafer to the set of pixel readout circuit interconnects on the readout circuit wafer to an accuracy of less than 2 microns, and F) positioning one of the two wafers together face to face so as to align the set of photodiode interconnects to the set of pixel readout circuit interconnects to an accuracy of less than 2 microns so as to permit the bonding agent to bond the two wafers together providing electrical contact between the pixel conductive elements of the pixel readout circuits and the photodiode interconnects so as to electrical connect each pixel readout circuit on the readout circuit wafer to a pixel photodiode on the photodiode wafer.

23. The method of making a hybrid image sensor according to claim 22 wherein said photodiode layers comprise a material chosen from a group of photodiode materials consisting of silicon, germanium, indium phosphide, indium gallium arsenide, indium gallium aluminum arsenide, gallium arsenide, aluminum arsenide, indium aluminum arsenide, indium antimonide, gallium nitride, aluminum gallium nitride, indium arsenide, platinum silicide, other III-V compound semiconductors, other II-VI compound semiconductors, and other IV-VII compound semiconductors.

24. A method for making a hybrid image sensor utilizing a wafer-to-wafer bonding technique comprising:

A) utilizing a first lithographic process to fabricate on a first wafer at least one readout circuit, each of said at least one readout circuit comprising an array of pixel readout circuits and also comprising supporting circuits, each pixel readout circuit in said array of readout circuits comprising at least one pixel conductive element, B) including, during the first lithographic process the deposition of a first bonding agent layer covering the at least one readout circuit, C) including in each pixel of the array of pixel readout circuits at least one lithographically produced conductive interconnect passing through said first bonding agent layer to provide electrical communication to said at least one pixel conductive element, all of the conductive interconnects in the array of pixel readout circuits defining a set of pixel readout circuit interconnects, D) utilizing a second lithographic process to fabricate at least one array of pixel photodiodes of on a second substrate wafer to define a photodiode wafer and an array of pixel photodiodes, each pixel photodiode in the array of pixel photodiodes defining at least a photodetector structure and a conductive pixel pad, E) fabricating on each of the photodiode wafer and the readout circuit wafer at least one alignment feature adapted to permit alignment of the set of pixel photodiode interconnects on the photodiode wafer to the set of pixel readout circuit interconnects on the readout circuit wafer to an accuracy of less than 2 microns, and F) positioning one of the two wafers together face to face so as to align the set of photodiode interconnects to the set of pixel readout circuit interconnects to an accuracy of less than 2 microns, applying a single or combination of mechanical, thermal and electrical means to the two wafers so as to permit the bonding agent to bond the two wafers together providing electrical contact between the readout circuit interconnects and the conductive pixel pads so as to electrical connect each pixel readout circuit on the readout circuit wafer to a pixel photodiode on the photodiode wafer.

25. The method of making a hybrid image sensor according to claim 24 wherein said photodiode layers comprise a single or a combination of materials chosen from a group of materials consisting of silicon, germanium, indium phosphide, indium gallium arsenide, indium gallium aluminum arsenide, gallium arsenide, aluminum arsenide, indium aluminum arsenide, indium antimonide, gallium nitride, aluminum gallium nitride, indium arsenide, platinum silicide, other III-V compound semiconductors, other II-VI compound semiconductors, and other IV-VII compound semiconductors.

* * * * *